(12) United States Patent
Lee et al.

(10) Patent No.: US 10,298,197 B2
(45) Date of Patent: May 21, 2019

(54) BULK ACOUSTIC WAVE RESONATOR AND METHOD OF MANUFACTURING THE SAME

(71) Applicant: Samsung Electro-Mechanics Co., Ltd., Suwon-si (KR)

(72) Inventors: Moon Chul Lee, Suwon-si (KR); Jae Chang Lee, Suwon-si (KR); Chang Hyun Lim, Suwon-si (KR); Tae Hun Lee, Suwon-si (KR); Tae Kyung Lee, Suwon-si (KR); Tae Yoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 159 days.

(21) Appl. No.: 15/487,620

(22) Filed: Apr. 14, 2017

(65) Prior Publication Data

US 2018/0048281 A1 Feb. 15, 2018

(30) Foreign Application Priority Data

Aug. 11, 2016 (KR) .......................... 10-2016-0102565

(51) Int. Cl.
*H03H 9/02* (2006.01)
*H01L 41/047* (2006.01)
*H03H 9/54* (2006.01)
*H03H 9/56* (2006.01)
*H03H 9/17* (2006.01)

(52) U.S. Cl.
CPC ....... *H03H 9/02102* (2013.01); *H01L 41/047* (2013.01); *H03H 9/542* (2013.01); *H03H 9/564* (2013.01); *H03H 9/173* (2013.01)

(58) Field of Classification Search
CPC .... H03H 9/02102; H03H 9/542; H03H 9/564; H03H 9/173; H01L 41/047
USPC .......................................................... 333/187
See application file for complete search history.

(56) References Cited

U.S. PATENT DOCUMENTS

| | | | |
|---|---|---|---|
| 9,246,468 B2 * | 1/2016 | Son ........................ | H03H 9/173 |
| 2004/0113720 A1 | 6/2004 | Komuro et al. | |
| 2008/0169728 A1 | 7/2008 | Asai et al. | |
| 2012/0161902 A1 | 6/2012 | Feng et al. | |
| 2013/0027153 A1 * | 1/2013 | Shin ................... | H03H 9/02102 |
| | | | 333/133 |

(Continued)

FOREIGN PATENT DOCUMENTS

| JP | 2004-193929 A | 7/2004 |
|---|---|---|
| JP | 2006-352619 A | 12/2006 |

(Continued)

OTHER PUBLICATIONS

Japanese Office Action dated Jun. 26, 2018, in corresponding Japanese Application No. 2017-088580 (4 pages in English, 2 pages in Japanese).

*Primary Examiner* — Benny T Lee
*Assistant Examiner* — Hafizur Rahman
(74) *Attorney, Agent, or Firm* — NSIP Law

(57) ABSTRACT

A bulk acoustic wave resonator includes: a substrate; a cavity forming layer disposed on the substrate so as to form a cavity; a lower electrode disposed on the cavity; a piezoelectric layer disposed on the lower electrode; an upper electrode disposed on the piezoelectric layer; and a temperature compensation layer disposed below the lower electrode and in the cavity portion.

25 Claims, 10 Drawing Sheets

(56) References Cited

U.S. PATENT DOCUMENTS

2014/0159548 A1\* 6/2014 Burak ................ H03H 9/02118
310/346
2015/0280687 A1\* 10/2015 Burak .................... H03H 9/132
310/321

FOREIGN PATENT DOCUMENTS

| | | |
|---|---|---|
| JP | 2007-510386 A | 4/2007 |
| JP | 2008-160694 A | 7/2008 |
| JP | 2008-172713 A | 7/2008 |
| JP | 2013-138425 A | 7/2013 |
| WO | WO 2005/043756 A1 | 5/2005 |

\* cited by examiner

BULK ACOUSTIC WAVE RESONATOR AND METHOD OF MANUFACTURING THE SAME

CROSS-REFERENCE TO RELATED APPLICATIONS

This application claims the benefit under 35 U.S.C. § 119(a) of Korean Patent Application No. 10-2016-0102565 filed on Aug. 11, 2016, in the Korean Intellectual Property Office, the entire disclosure of which is incorporated herein by reference for all purposes.

BACKGROUND

1. Field

The following description relates to a bulk acoustic wave resonator or bulk acoustic filter device, and a method of manufacturing the same.

2. Description of Related Art

Recently, with the rapid development of communications technology, there has been a demand for further development of signal processing technology and radio frequency (RF) component technology for use in communications devices.

Particularly, with the trend towards the miniaturization of wireless communications devices, there has also been a demand for miniaturization of RF component technology. For example, the miniaturization of filters has been achieved by manufacturing bulk acoustic wave (BAW) resonator type filters using semiconductor thin-film wafer manufacturing technology.

A BAW resonator is a thin-film type element including a piezoelectric dielectric material deposited on a semiconductor substrate such as a silicon wafer. A BAW resonator generates resonance using piezoelectric characteristics of the piezoelectric dielectric material and may be implemented as a filter.

A BAW resonator may be used in applications such as a small and light filter, an oscillator, a resonance element, or an acoustic resonance mass sensor of a mobile communications device, a chemical device, or a biological device.

Various structural shapes and functions for enhancing the characteristics of BAW resonators have been studied. Particularly, studies of structures and techniques to reduce a change in device characteristics resulting from a change in temperature have been conducted.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic filter device includes: a substrate; a cavity forming layer disposed on the substrate so as to form a cavity; a lower electrode disposed on the cavity; a piezoelectric layer disposed on the lower electrode; an upper electrode disposed on the piezoelectric layer; and a temperature compensation layer disposed below the lower electrode and in the cavity.

The temperature compensation layer may include a first temperature compensation layer disposed in the cavity and a second temperature compensation layer disposed under the lower electrode.

The first temperature compensation layer may include ruthenium (Ru) or molybdenum (Mo).

The cavity forming layer may include a first sacrificial layer disposed on a first oxide layer disposed on the substrate, a second oxide layer disposed on the first sacrificial layer, and a second sacrificial layer disposed on the second oxide layer.

The cavity may include a first cavity portion disposed at a central portion of the first sacrificial layer, and second cavity portion disposed at a central portion of the second sacrificial layer. The first and second cavity portions may be partitioned by the second oxide layer.

The first cavity portion may communicate with the second cavity portion.

The temperature compensation layer may be disposed on the first cavity portion.

The first sacrificial layer may include a first protective wall disposed at an edge of the first cavity portion and including oxide, and the second sacrificial layer may include a second protective wall disposed at an edge of the second cavity portion and including oxide.

The upper electrode may include a frame layer disposed on the piezoelectric layer, and an electrode layer covering the piezoelectric layer and the frame layer.

The bulk acoustic filter device may further include a protective layer exposing a portion of the upper electrode and a portion of the lower electrode.

The bulk acoustic filter device may further include: an electrode pad disposed at a portion of the upper electrode and a portion of the lower electrode that are exposed from the protective layer.

The cavity forming layer may be laminated on the substrate.

In another general aspect, a method to manufacture a bulk acoustic filter device includes: forming a first sacrificial layer including a first protective wall on a first oxide layer of a substrate; forming a second oxide layer on the first sacrificial layer; forming a second sacrificial layer including a second protective wall on the second oxide layer; removing a central portion of the second sacrificial layer and a central portion of the second oxide layer; forming a first temperature compensation layer on a portion of the first sacrificial layer from which the central portion of the second sacrificial layer and the central portion of the second oxide layer are removed; and forming a second temperature compensation layer on the first temperature compensation layer.

The method may further include: forming a lower electrode on the second temperature compensation layer; forming a piezoelectric layer so that the piezoelectric layer is disposed on the second temperature compensation layer and the lower electrode; and forming an upper electrode so that the upper electrode is disposed on the piezoelectric layer.

The method may further include: planarizing the first and second temperature compensation layers to form a flat surface, before the forming of the lower electrode, the forming of the piezoelectric layer, and the forming of the upper electrode. The forming of the lower electrode may further include forming the lower electrode on the flat surface. The forming of the piezoelectric layer may further include forming the piezoelectric layer on the flat surface.

The method may further include: removing an edge portion of the upper electrode and an edge portion of the piezoelectric layer, which are externally exposed; disposing a protective layer on portions of the second sacrificial layer, the lower electrode, the piezoelectric layer, and the upper electrode that are externally exposed; externally exposing a portion of the upper electrode and a portion of the lower electrode by removing a portion of the protective layer; and forming an electrode pad on the portion of the upper electrode and the portion of the lower electrode that are externally exposed by the removing of the portion of the protective layer.

The method may further include: forming a first cavity portion by removing a portion of the first sacrificial layer disposed inside of the first protective wall; and forming a second cavity portion by removing a portion of the second sacrificial layer disposed inside of the second protective wall.

The first temperature compensation layer may include ruthenium (Ru) or molybdenum (Mo).

In another general aspect, a bulk acoustic filter device includes: a substrate; a cavity forming layer disposed above the substrate; a first cavity portion disposed above the substrate, within the cavity forming layer; a second cavity portion disposed above the first cavity portion, within the cavity forming layer; a temperature compensation layer disposed in the second cavity portion; a lower electrode disposed above the temperature compensation layer; a piezoelectric layer disposed above the lower electrode; and an upper electrode disposed above the piezoelectric layer.

The cavity forming layer may include a first polysilicon layer, an oxide layer disposed above the first polysilicon layer, and a second polysilicon layer disposed above the oxide layer.

The first cavity portion and the second cavity portion may be partitioned by the oxide layer.

The temperature compensation layer may include a first temperature compensation layer, and a second temperature compensation layer disposed above the first temperature compensation layer and below the lower electrode.

The second temperature compensation layer may include a first flat upper surface. The first temperature compensation layer may include a second flat upper surface disposed around and coplanar with respect to the first flat upper surface. The lower electrode and the piezoelectric layer may be disposed on the first and second flat upper surfaces.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
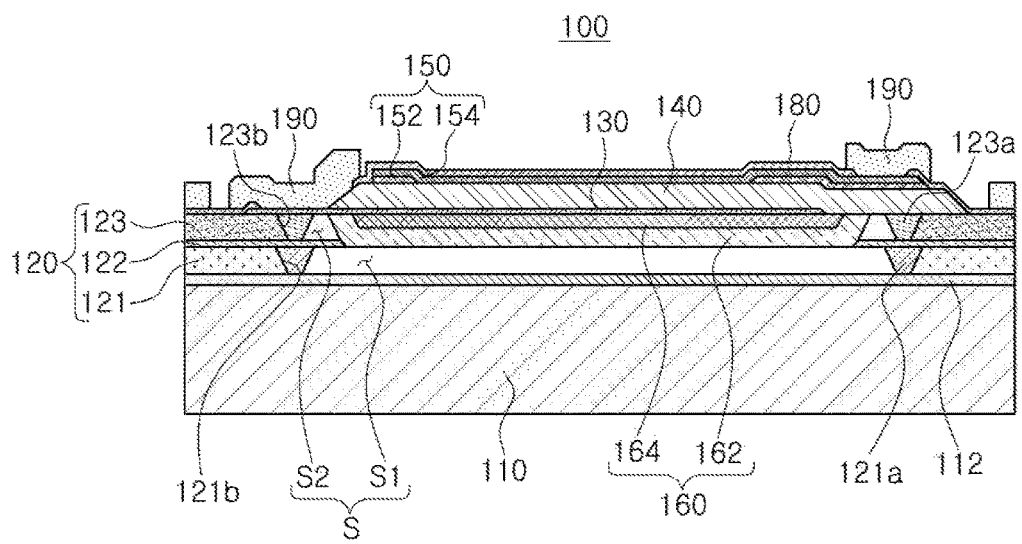
FIG. 1 is a schematic cross-sectional view illustrating a bulk acoustic wave resonator or bulk acoustic filter device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic cross-sectional view illustrating a bulk acoustic wave resonator or bulk acoustic filter device 100, according to an embodiment.

Referring to FIG. 1, the bulk acoustic filter device 100 includes, for example, a substrate 110, a space forming layer or cavity forming layer 120, a lower electrode 130, a piezoelectric layer 140, an upper electrode 150, a temperature compensation layer 160, a protective layer 180, and an electrode pad 190.

The substrate 110 may be a substrate on which silicon is laminated. For example, the substrate 110 is a silicon wafer. A first oxide layer 112 is provided on the substrate 110.

The cavity forming layer 120, in which a space or cavity S is formed, is laminated on the substrate 110. For example, the cavity forming layer 120 includes a first sacrificial layer 121, a second oxide layer 122, and a second sacrificial layer 123.

The first sacrificial layer 121 is formed on the first oxide layer 112. The first sacrificial layer 121 may be formed of a polysilicon material. The first sacrificial layer 121 includes a first protection wall 121a that forms a first space portion or cavity portion S1 of the cavity S. That is, an interior of the first protective wall 121a forms the first cavity portion S1.

Further, a second oxide layer 122 is formed on the first sacrificial layer 121. The second oxide layer 122 protrudes toward the cavity S. Further, the first protective wall 121a and the second oxide layer 122 may be formed of the same material and are connected to each other.

The second sacrificial layer 123 is formed on the second oxide layer 122. For example, the second sacrificial layer 123 is formed of a polysilicon material, which is the same as the material of the first sacrificial layer 121. The second sacrificial layer 123 includes a second protection wall 123a that forms a second space portion or cavity portion S2 of the cavity S. That is, an interior of the second protective wall 123a forms the second cavity portion S2.

The first and second cavity portions S1 and S2 are partitioned by the second oxide layer 122, and the first and second cavity portions S1 and S2 are connected to each other.

The lower electrode 130 is disposed on the cavity S. For example, the lower electrode is formed on the second sacrificial layer 123 and a second temperature compensation layer 164 of the temperature compensation layer 160. Further, the lower electrode 130 may be formed of a conductive material such as molybdenum (Mo), ruthenium (Ru), or tungsten (W).

Further, the lower electrode 130 is used as an input electrode or an output electrode for applying electrical signals, such as RF signals, to the piezoelectric layer 140. For example, when the lower electrode 130 is the input electrode, the upper electrode 150 is the output electrode.

The piezoelectric layer 140 is formed on the lower electrode 130. For example, the piezoelectric layer 140 is formed by depositing aluminum nitride, zinc oxide, or lead zirconate titanate. Further, the piezoelectric layer converts the electrical signal input from the lower electrode or the upper electrode into an acoustic wave.

For example, when an electric field that varies over time is induced into the lower electrode 130, the piezoelectric layer 140 converts the electrical signal input to the lower electrode 130 into physical vibrations. That is, when the electric field is induced into the lower electrode 130, the piezoelectric layer 140 generates a bulk acoustic wave oriented in the thickness direction in the piezoelectric layer 140 using the induced electric field. Thus, the piezoelectric layer 140 generates the bulk acoustic wave from the electrical signal.

Further, the upper electrode 150 is formed on the piezoelectric layer 140. For example, the upper electrode 150 is also be formed of a conductive material such as molybdenum (Mo), ruthenium (Ru), or tungsten (W).

Further, the upper electrode 150 is used as an input electrode or an output electrode for applying electrical signals, such as RF signals, to the piezoelectric layer 140. For example, when the upper electrode 150 is the output electrode, the lower electrode 130 is the output electrode.

The upper electrode 150 includes a frame layer 152 laminated on the piezoelectric layer 140 and an electrode layer 154 formed to cover the piezoelectric layer 140 and the frame layer 152. The frame layer 152 adjusts the bulk acoustic wave and may be formed of the same material as the electrode layer 154.

The temperature compensation layer 160 is disposed below the lower electrode 130. For example, the temperature compensation layer 160 disposed in the second cavity portion S2 of the cavity S. The temperature compensation layer 160 includes a first temperature compensation layer 162 disposed the cavity S and the second temperature compensation layer 164, which is disposed under the lower electrode 130.

That is, the first temperature compensation layer 162 and the second temperature compensation layer 164 of the temperature compensation layer 160 are sequentially laminated and inserted into the cavity S.

The first temperature compensation layer 162 may be formed of a metal material, such as ruthenium (Ru) or molybdenum (Mo). Further, the second temperature compensation layer 164 is disposed on the first temperature compensation layer 162. That is, the second temperature compensation layer 164 is disposed between the first temperature compensation layer 162 and the lower electrode 130. For example, the second temperature compensation layer 164 are formed of the same material as the first and second oxide layers 112 and 121.

The protective layer 180 is formed to expose a portion of the upper electrode 150 and a portion of the lower electrode 130. That is, the protective layer 180 covers the overall area occupied by the upper electrode 150 and the lower electrode 130, other than a portion of the upper electrode 150 and a portion of the lower electrode 130. The protective layer 180 may be formed of an oxide material.

The electrode pad 190 is formed at portions of the upper electrode 150 and the lower electrode 130 exposed through the protective layer 180. The electrode pad 190 is formed of a conductive material such as gold (Au) or copper (Cu).

As described above, the temperature compensation layer 160 is disposed in the second cavity portion S2, and therefore the bulk acoustic filter device 100 may be manufactured by a process having a same level of difficulty as an existing simple resonator implementation. That is, the lower electrode 130 and the piezoelectric layer 140 are laminated on the second temperature compensation layer 164, which has a flat upper surface, and therefore the difficulty of the lamination process may be reduced. The lower electrode 130 and the piezoelectric layer 140 are also laminated on a flat upper surface of the first temperature compensation layer 162 that is disposed around and coplanar with respect to the flat upper surface of the second temperature compensation layer 164.

Further, the bulk acoustic filter device 100 includes the temperature compensation layer 160 to improve temperature characteristics.

FIGS. 2 through 24 are process diagrams illustrating a method of manufacturing the bulk acoustic filter device 100, according to an embodiment.

First, as shown in FIGS. 2 through 10, the cavity forming layer 120 is formed on the first oxide layer 112 of the substrate 110.

Figure 2:
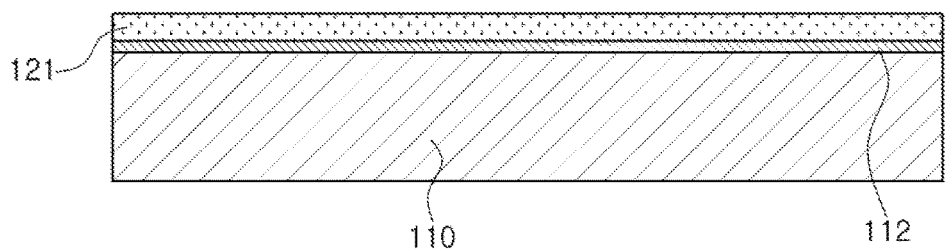
FIGS. 2 through 24 are process diagrams illustrating a method of manufacturing a bulk acoustic wave resonator or bulk acoustic filter device, according to an embodiment.

Describing the formation of the cavity forming layer 120 in detail, as shown in FIG. 2, the first sacrificial layer 121 is formed on the first oxide layer 112. For example, the first sacrificial layer 121 is laminated on the first oxide layer 112. The first sacrificial layer 121 may be formed of a polysilicon material. Further, after the first sacrificial layer 121 is laminated, a planarization operation is performed on the first sacrificial layer 121 by chemical mechanical polishing (CMP).

Figure 3:
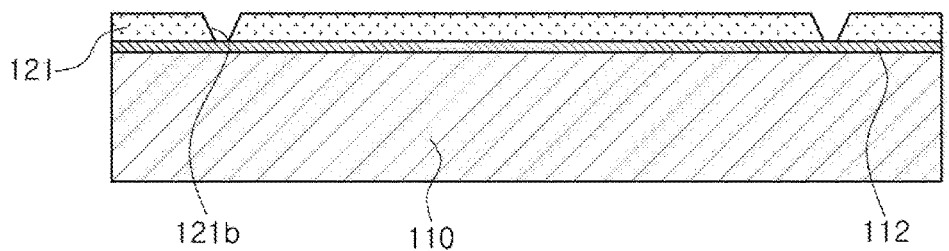

Thereafter, as shown in FIG. 3, a groove 121b is formed in the first sacrificial layer 121 by patterning.

Figure 4:
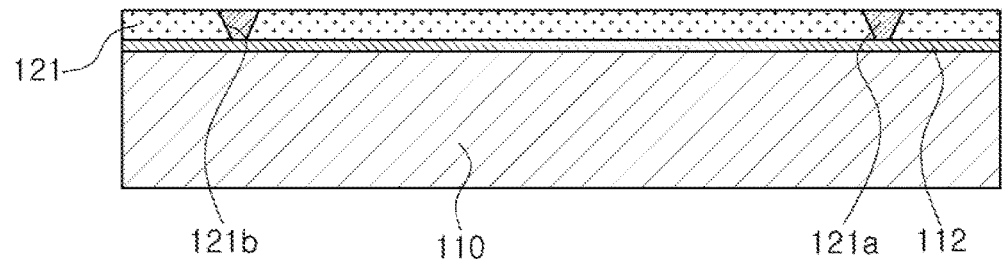

Thereafter, as shown in FIG. 4, the first protective wall 121a is formed in the groove 121b. For example, the first protective wall 121a is formed of the same material as that of the first oxide layer 112. Further, after the first protective wall 121a is formed, a planarization operation is performed on the first protective wall 121a by chemical mechanical polishing (CMP).

Figure 5:
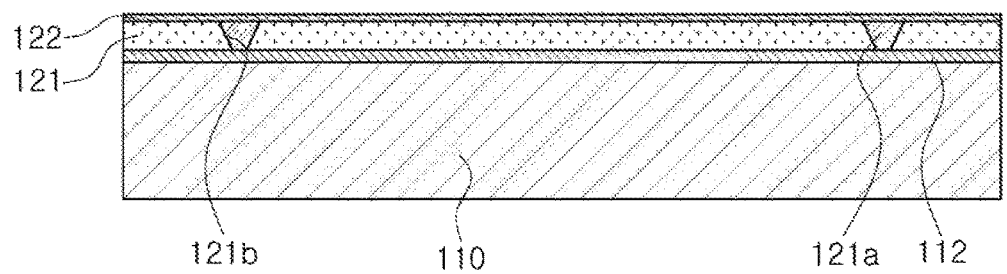

Thereafter, as shown in FIG. 5, the second oxide layer 122 is formed on the first sacrificial layer 121 and first the protective wall 121a. For example, the second oxide layer 122 is formed of the same material as the first oxide layer 112 and the first protective wall 121a.

Figure 6:
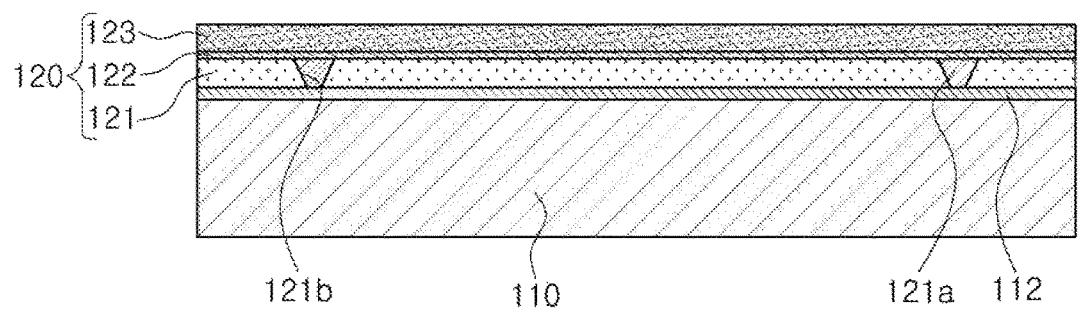

Thereafter, as shown in FIG. 6, the second sacrificial layer 123 is formed on the second oxide layer 122. For example, the second sacrificial layer 123 is laminated on the second oxide layer 122.

The second sacrificial layer 123 may also be formed of a polysilicon material, and may be formed of the same material as that of the first sacrificial layer 121. Further, after the second sacrificial layer 123 is laminated, a planarization operation is performed on the second sacrificial layer 123 by chemical mechanical polishing (CMP).

Figure 7:
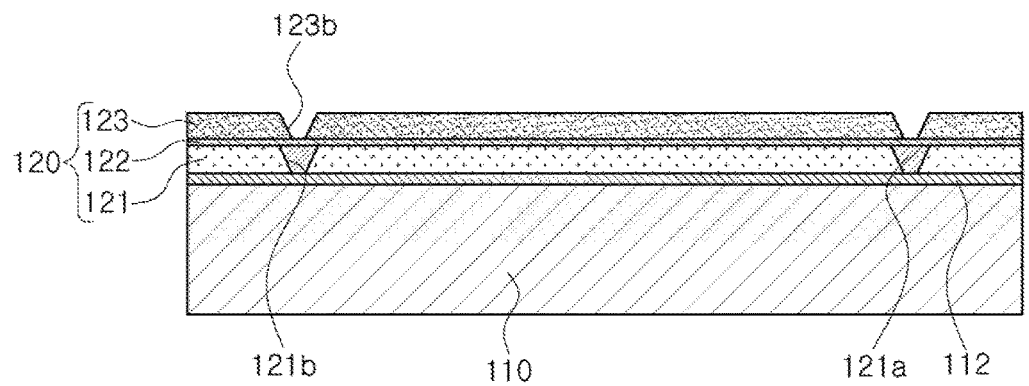

Thereafter, as shown in FIG. 7, a groove 123b is formed in the second sacrificial layer 123 by the patterning.

Figure 8:
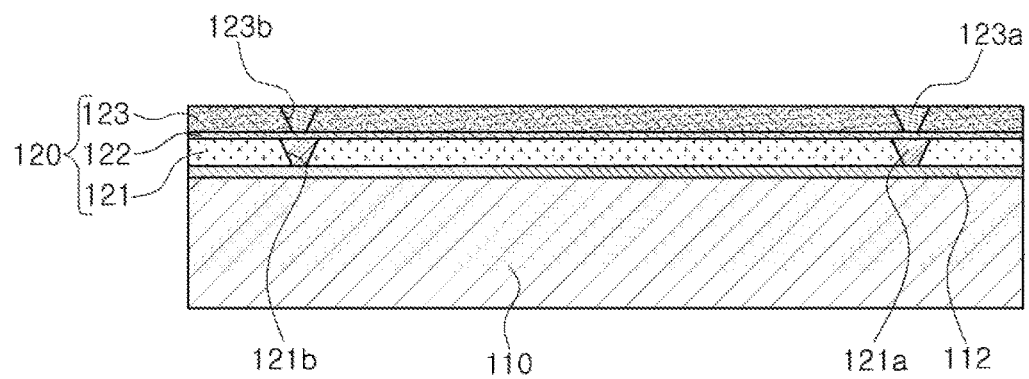

Thereafter, as shown in FIG. 8, a second protective wall 123a is formed in the groove 123b. For example, the second protective wall 123a is formed of the same material as that of the first oxide layer 112. Further, after the second protective wall 123a is formed, a planarization operation may be performed on the second protective wall 123a by chemical mechanical polishing (CMP).

Figure 9:
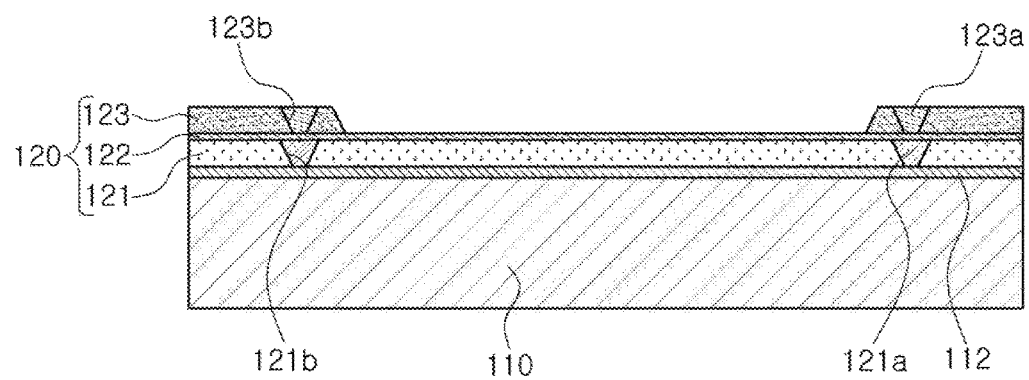

Thereafter, as shown in FIG. 9, a central portion of the second sacrificial layer 123 is removed by, for example, releasing using xenon fluoride ($XeF_2$).

Figure 10:
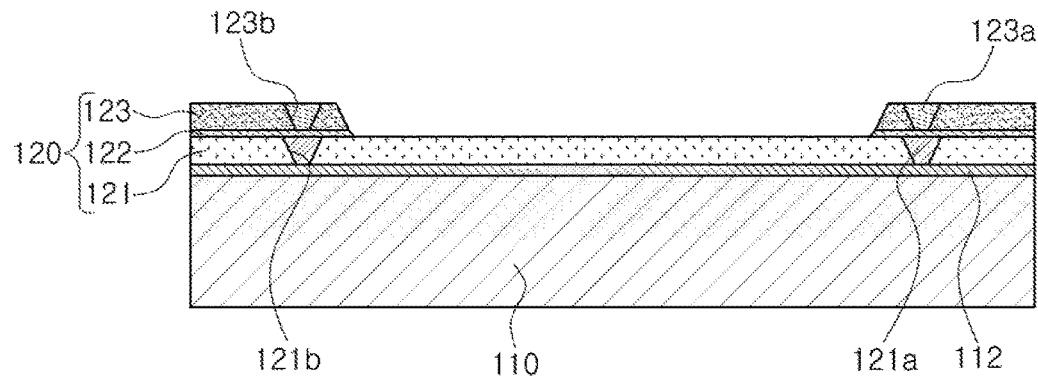

Thereafter, as shown in FIG. 10, a central portion of second oxide layer 122 exposed by removing the central portion of the second sacrificial layer 123 is removed to ensure flatness.

Figure 11:
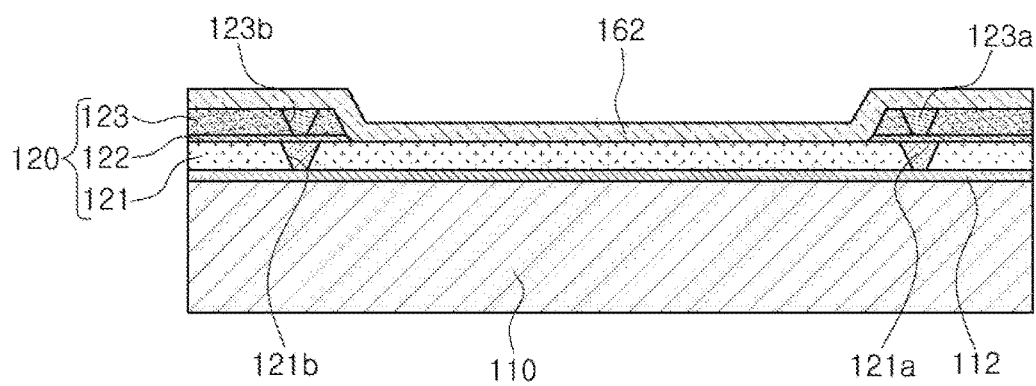

Thereafter, as shown in FIG. 11, the first temperature compensation layer 162 is formed in an area in which the second sacrificial layer 123 has been removed and on the second sacrificial layer 123. The first temperature compensation layer 162 is formed of a metal material of such as ruthenium (Ru) or molybdenum (Mo), for example.

Figure 12:
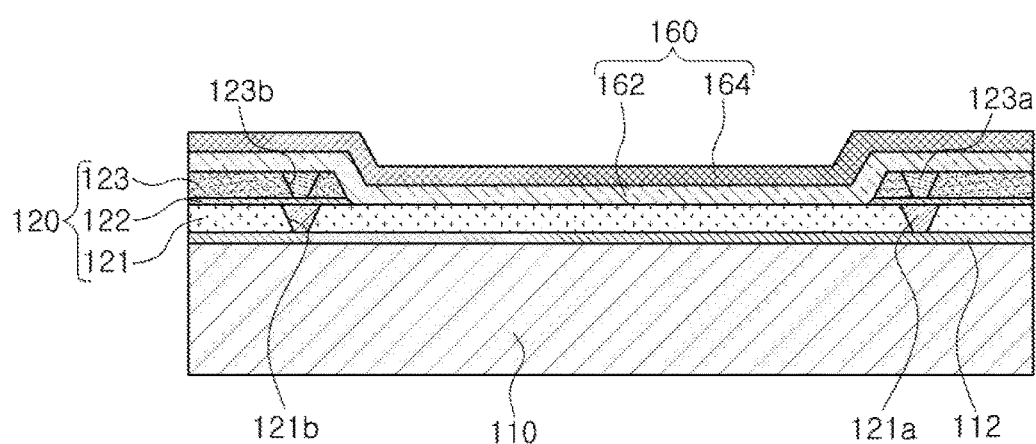

Further, as shown in FIG. 12, the second temperature compensation layer 164 is laminated on the first temperature compensation layer 162.

Figure 13:
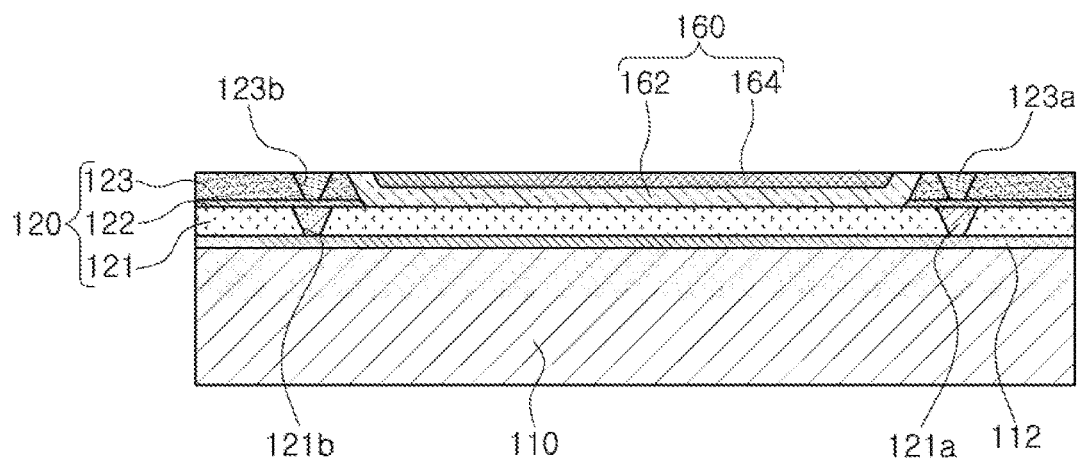

Thereafter, as shown in FIG. 13, for example, a planarization operation is performed on the first temperature compensation layer 162 and the second temperature compensation layer 164 by chemical mechanical polishing (CMP). Therefore, portions of the first temperature compensation layer 162 and the second temperature compensation layer 164 laminated on the second sacrificial layer 123 are removed.

As a result, the second temperature compensation layer 164, which is planarized, is exposed externally and the first temperature compensation layer 162 is disposed on a bottom surface of the second temperature compensation layer 164.

Figure 14:
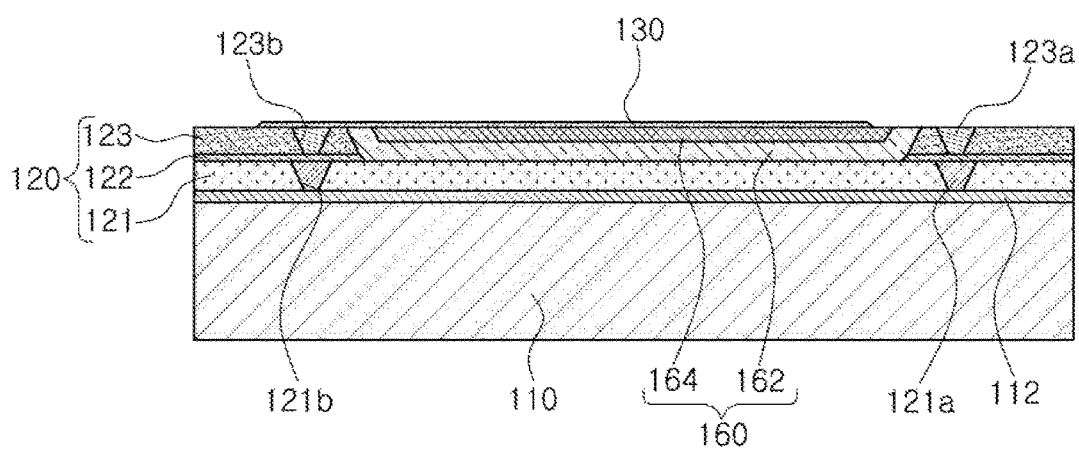

Thereafter, as shown in FIG. 14, the lower electrode 130 is disposed on the second temperature compensation layer 164. The lower electrode 130 may be formed of a conductive material such as molybdenum (Mo), ruthenium (Ru), or tungsten (W).

Figure 15:
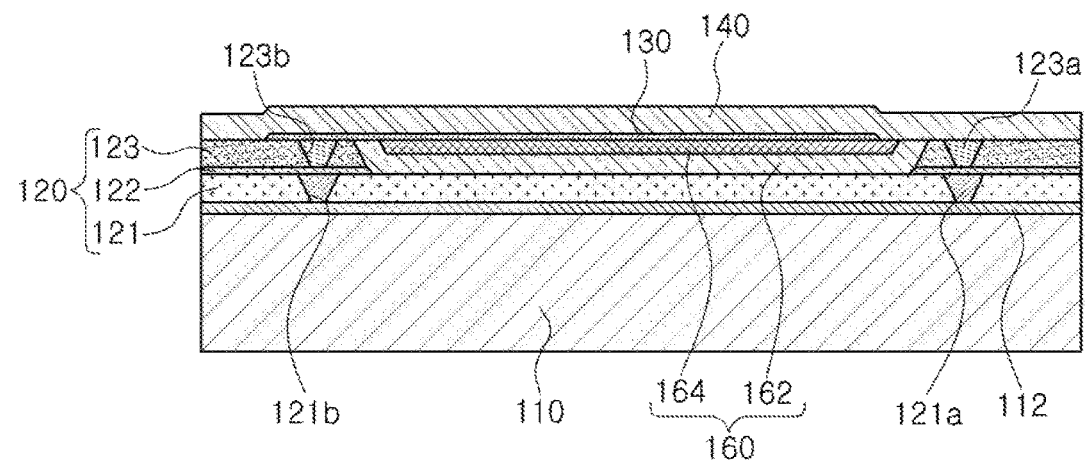

Thereafter, as shown in FIG. 15, the piezoelectric layer 140 is formed to cover the lower electrode 130. For example, the piezoelectric layer 140 is formed by depositing aluminum nitride, zinc oxide, or lead zirconate titanate.

Figure 16:
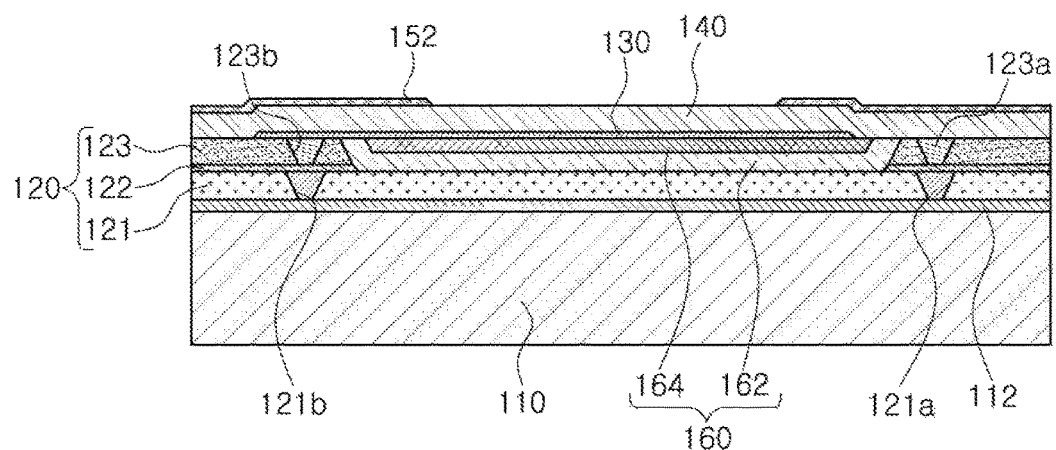

Thereafter, as shown in FIG. 16, the frame layer 152 is laminated on the piezoelectric layer 140. The frame layer 152 is laminated so that a center portion of the piezoelectric layer 140 is exposed externally.

Figure 17:
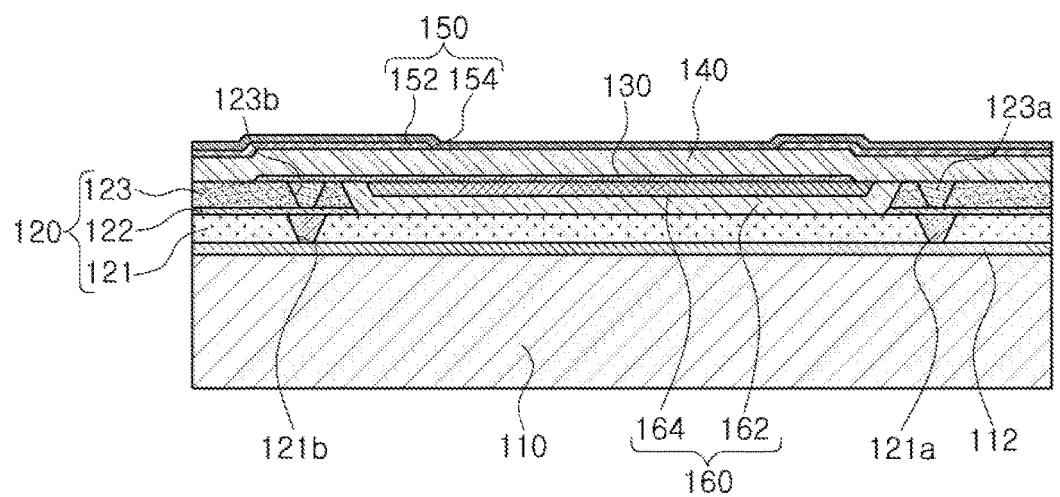

Thereafter, as shown in FIG. 17, the electrode layer 154 is laminated on the externally exposed center portion of the piezoelectric layer 140 and on the frame layer 152, thereby forming the upper electrode 150 together with the frame layer 152. The frame layer 152 and the electrode layer 154 may be formed of a conductive material such as molybdenum (Mo), ruthenium (Ru), or tungsten (W).

Figure 18:
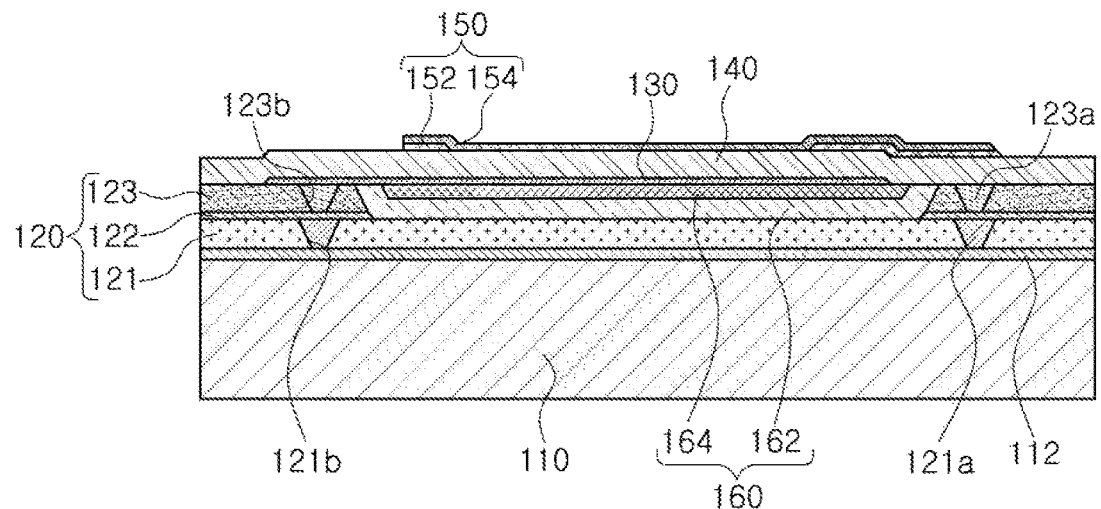

Thereafter, as shown in FIG. 18, an edge portion of the upper electrode 150 is removed by the patterning.

Figure 19:
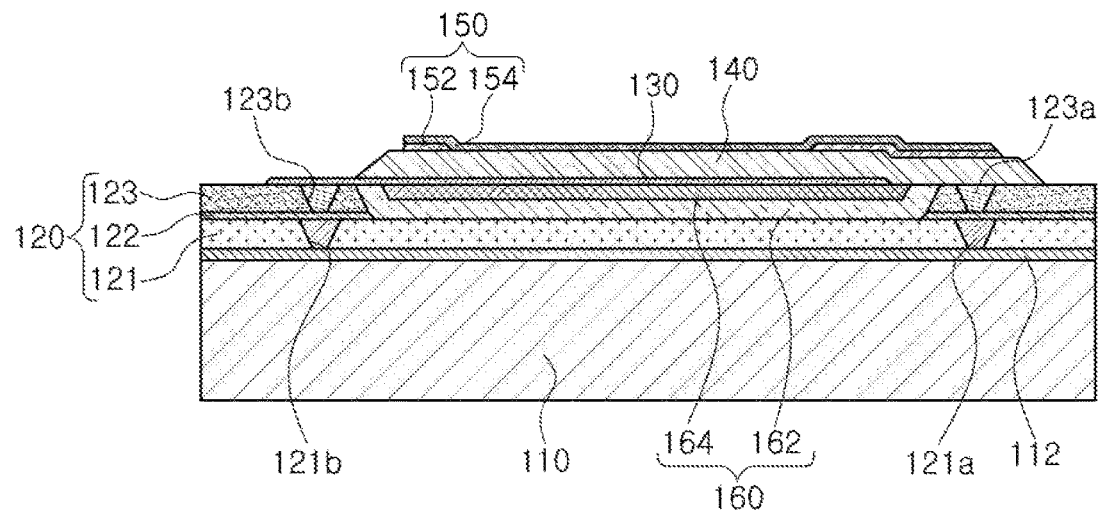

Thereafter, as shown in FIG. 19, an edge portion of the piezoelectric layer 140 is removed by patterning. Therefore, an edge of the second sacrificial layer 123 is exposed externally when a portion of the lower electrode 130 is exposed externally.

Figure 20:
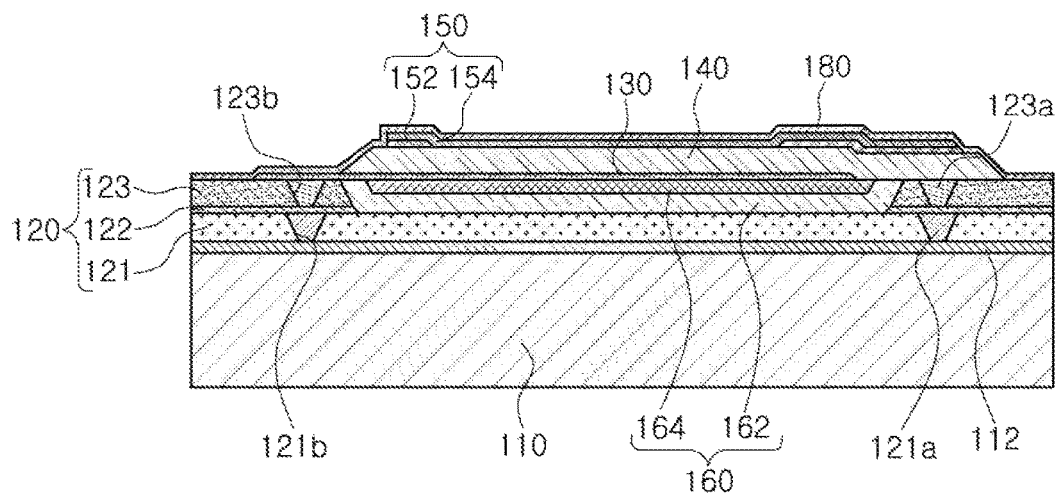

Thereafter, as shown in FIG. 20, the protective layer 180 is laminated on the second sacrificial layer 123, the piezoelectric layer 140, the frame layer 152, the electrode layer 154, and the lower electrode 130. The protective layer 180 is formed to protect the upper electrode 150, the piezoelectric layer 140, and the lower electrode 130, and may be made of a metal oxide material.

Figure 21:
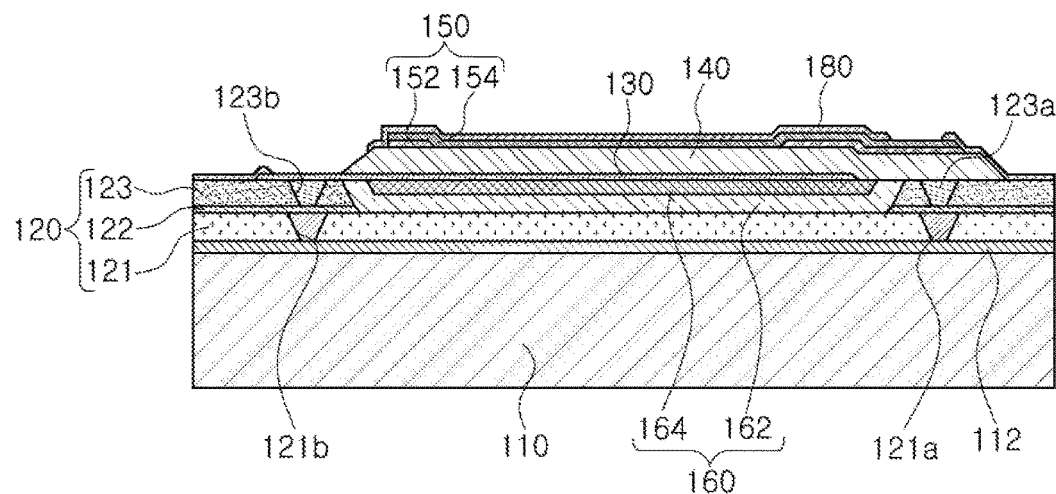

Thereafter, as shown in FIG. 21, a portion of the protective layer 180 is removed by patterning so that a portion of the lower electrode 130 and a portion of the upper electrode 150 are exposed externally.

Figure 22:
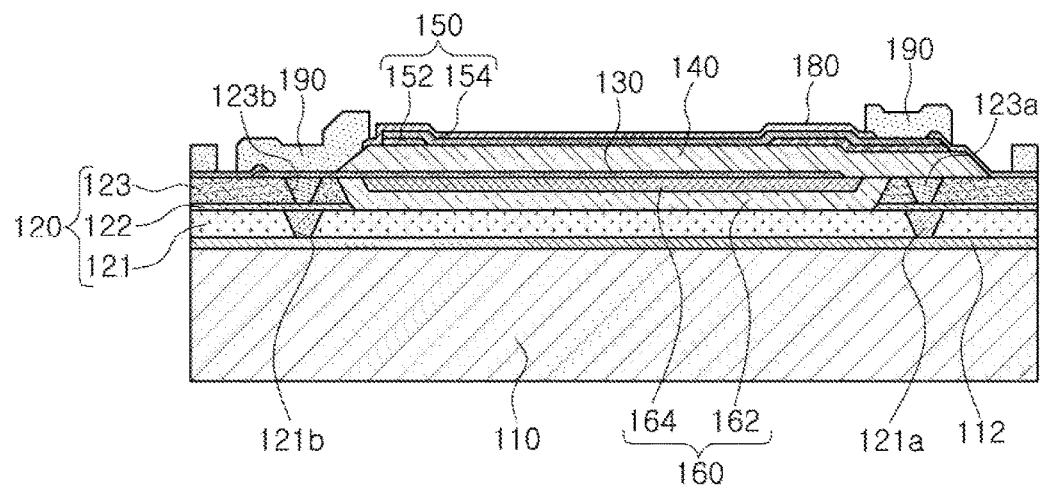

Thereafter, as shown in FIG. 22, the electrode pad 190 is formed on the portions of the lower electrode 130 and the upper electrode 150 that are exposed externally. The electrode pad 190 may be formed of a gold (Au) or copper (Cu) material.

Figure 23:
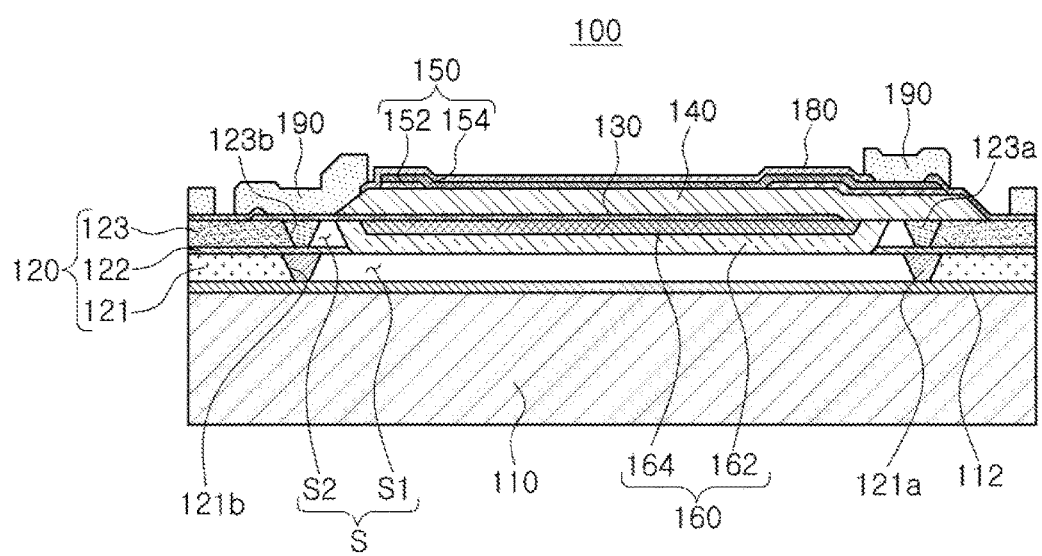

Thereafter, as shown in FIG. 23, portions of the first and second sacrificial layers 121 and 123 disposed at an inside of the first and second protective walls 121a and 123a are removed by releasing using xenon fluoride ($XeF_2$). As a result, the cavity S is formed, and includes the second cavity portion S2, in which the first temperature compensation layer 162 and the second temperature compensation layer 164 are disposed, and the first cavity portion S1 disposed below the first temperature compensation layer 162.

Further, the first and second cavity portions S1 and S2 are partitioned by the second oxide layer 122.

Figure 24:
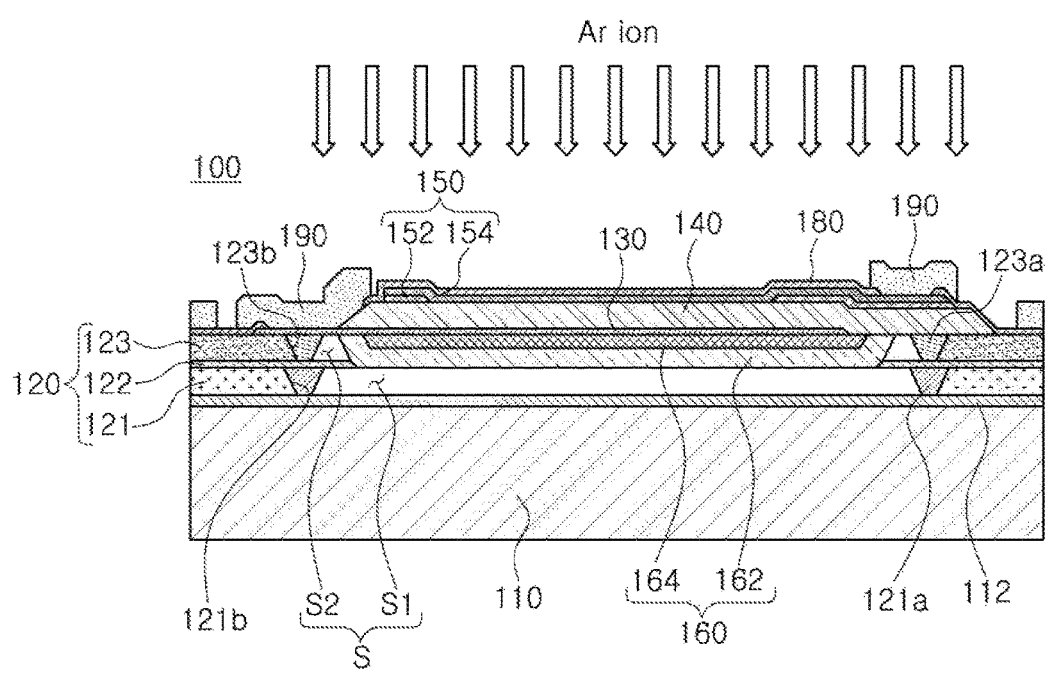

Thereafter, as shown in FIG. 24, trimming of the resulting structure is performed using argon ions, in order to form the bulk acoustic filter device 100.

As described above, the temperature compensation layer 160 is formed to be disposed in the cavity S, and therefore it is possible to avoid or mitigate an increase in the difficulty of the manufacturing process due to the temperature compensation layer 160. That is, the lower electrode 130 and the piezoelectric layer 140 are formed on the second temperature compensation layer 164 that is planarized, and therefore it is possible to suppress an increase in the difficulty of the manufacturing process at the time of laminating the temperature compensation layer 160.

As set forth above, according to the embodiments disclosed herein, the bulk acoustic filter device has improved temperature characteristics and may be easily manufactured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
   a substrate;
   a cavity forming layer disposed on the substrate so as to form a cavity;
   a lower electrode disposed on the cavity;
   a piezoelectric layer disposed on the lower electrode;
   an upper electrode disposed on the piezoelectric layer; and
   a temperature compensation layer disposed below the lower electrode and in the cavity, and disposed spaced apart from the substrate.

2. The bulk acoustic wave resonator of claim 1, wherein the temperature compensation layer comprises a first temperature compensation layer disposed in the cavity and a second temperature compensation layer disposed under the lower electrode.

3. The bulk acoustic wave resonator of claim 2, wherein the first temperature compensation layer comprises ruthenium (Ru) or molybdenum (Mo).

4. The bulk acoustic wave resonator of claim 1, wherein the cavity forming layer comprises
   a first sacrificial layer disposed on a first oxide layer disposed on the substrate,
   a second oxide layer disposed on the first sacrificial layer, and
   a second sacrificial layer disposed on the second oxide layer.

5. The bulk acoustic wave resonator of claim 4, wherein the cavity comprises a first cavity portion disposed at a central portion of the first sacrificial layer, and a second cavity portion disposed at a central portion of the second sacrificial layer, and
   the first and second cavity portions are partitioned by the second oxide layer.

6. The bulk acoustic wave resonator of claim 5, wherein the first cavity portion communicates with the second cavity portion.

7. The bulk acoustic wave resonator of claim 5, wherein the temperature compensation layer is disposed on the first cavity portion.

8. The bulk acoustic wave resonator of claim 5, wherein the first sacrificial layer comprises a first protective wall disposed at an edge of the first cavity portion and comprising oxide, and the second sacrificial layer comprises a second protective wall disposed at an edge of the second cavity portion and comprising oxide.

9. The bulk acoustic wave resonator of claim 1, wherein the upper electrode comprises a frame layer disposed on the piezoelectric layer, and an electrode layer covering the piezoelectric layer and the frame layer.

10. The bulk acoustic wave resonator of claim 9, further comprising:
    a protective layer exposing a portion of the upper electrode and a portion of the lower electrode.

11. The bulk acoustic wave resonator of claim 10, further comprising:
    an electrode pad disposed at the portion of the upper electrode and the portion of the lower electrode that are exposed from the protective layer.

12. The bulk acoustic wave resonator of claim 1, wherein the cavity forming layer is laminated on the substrate.

13. The bulk acoustic wave resonator of claim 1, wherein the cavity forming layer comprises a sacrificial layer disposed on the substrate below the temperature compensation layer.

14. A method to manufacture a bulk acoustic wave resonator, comprising:
    forming a first sacrificial layer comprising a first protective wall on a first oxide layer of a substrate;
    forming a second oxide layer on the first sacrificial layer;
    forming a second sacrificial layer comprising a second protective wall on the second oxide layer;
    removing a central portion of the second sacrificial layer and a central portion of the second oxide layer;
    forming a first temperature compensation layer on a portion of the first sacrificial layer from which the central portion of the second sacrificial layer and the central portion of the second oxide layer are removed; and
    forming a second temperature compensation layer on the first temperature compensation layer.

15. The method of claim 14, further comprising:
    forming a lower electrode on the second temperature compensation layer;
    forming a piezoelectric layer so that the piezoelectric layer is disposed on the second temperature compensation layer and the lower electrode, and the piezoelectric layer comprises an externally exposed edge portion; and
    forming an upper electrode so that the upper electrode is disposed on the piezoelectric layer and the upper electrode comprises an externally exposed edge portion.

16. The method of claim 15, further comprising:
removing the externally exposed edge portion of the upper electrode and the externally exposed edge portion of the piezoelectric layer;
disposing a protective layer on portions of the second sacrificial layer, the lower electrode, the piezoelectric layer, and the upper electrode that are externally exposed;
externally exposing a portion of the upper electrode and a portion of the lower electrode by removing a portion of the protective layer; and
forming an electrode pad on the portion of the upper electrode and the portion of the lower electrode that are externally exposed by the removing of the portion of the protective layer.

17. The method of claim 16, further comprising:
forming a first cavity portion by removing a portion of the first sacrificial layer disposed inside of the first protective wall; and
forming a second cavity portion by removing a portion of the second sacrificial layer disposed inside of the second protective wall.

18. The method of claim 15, further comprising:
planarizing the first and second temperature compensation layers to form a flat surface, before the forming of the lower electrode, the forming of the piezoelectric layer, and the forming of the upper electrode,
wherein the forming of the lower electrode further comprises forming the lower electrode on the flat surface, and
wherein the forming of the piezoelectric layer further comprises forming the piezoelectric layer on the flat surface.

19. The method of claim 14, wherein the first temperature compensation layer comprises ruthenium (Ru) or molybdenum (Mo).

20. A bulk acoustic wave resonator, comprising:
a substrate;
a cavity forming layer disposed on the substrate so as to form a cavity;
a first temperature compensation layer disposed in the cavity;
a second temperature compensation layer disposed on the first temperature compensation layer;
a lower electrode disposed on the cavity, on an upper surface of the second temperature compensation layer and an upper surface of the first temperature compensation layer that is disposed around and coplanar with the upper surface of the second temperature compensation layer;
a piezoelectric layer disposed on the lower electrode; and
an upper electrode disposed on the piezoelectric layer.

21. A bulk acoustic wave resonator, comprising:
a substrate;
a cavity forming layer disposed above the substrate;
a first cavity portion disposed above the substrate, within the cavity forming layer;
a second cavity portion disposed above the first cavity portion, within the cavity forming layer;
a temperature compensation layer disposed in the second cavity portion;
a lower electrode disposed above the temperature compensation layer;
a piezoelectric layer disposed above the lower electrode; and
an upper electrode disposed above the piezoelectric layer.

22. The bulk acoustic wave resonator of claim 21, wherein the temperature compensation layer comprises a first temperature compensation layer, and a second temperature compensation layer disposed above the first temperature compensation layer and below the lower electrode.

23. The bulk acoustic wave resonator of claim 22, wherein
the second temperature compensation layer comprises a first flat upper surface,
the first temperature compensation layer comprises a second flat upper surface disposed around and coplanar with respect to the first flat upper surface, and
the lower electrode and the piezoelectric layer are disposed on the first and second flat upper surfaces.

24. The bulk acoustic wave resonator of claim 21, wherein the cavity forming layer comprises
a first polysilicon layer,
an oxide layer disposed above the first polysilicon layer, and
a second polysilicon layer disposed on the oxide layer.

25. The bulk acoustic wave resonator of claim 24, wherein the first cavity portion and the second cavity portion are partitioned by the oxide layer.

* * * * *